(12) United States Patent
Lauxtermann et al.

(10) Patent No.: US 7,852,124 B2
(45) Date of Patent: Dec. 14, 2010

(54) LOW NOISE CORRELATED DOUBLE SAMPLING AMPLIFIER FOR 4T TECHNOLOGY

(75) Inventors: Stefan C. Lauxtermann, Camarillo, CA (US); Adam Lee, Portland, OR (US); John Stevens, Porter Ranch, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 65 days.

(21) Appl. No.: 12/263,638

(22) Filed: Nov. 3, 2008

(65) Prior Publication Data

US 2010/0109711 A1    May 6, 2010

(51) Int. Cl.
  G11C 27/02    (2006.01)
  H03K 5/00     (2006.01)
  H03K 17/00    (2006.01)
(52) U.S. Cl. .......................................... 327/94; 327/554
(58) Field of Classification Search .................... 327/94, 327/95, 554
  See application file for complete search history.

(56) References Cited

U.S. PATENT DOCUMENTS

| | | | |
|---|---|---|---|
| 5,182,446 A | 1/1993 | Tew | |
| 5,892,540 A | 4/1999 | Kozlowski | |
| 6,166,766 A | 12/2000 | Moore | |
| 6,433,632 B1 | 8/2002 | Nakamura | |
| 6,532,040 B1 | 3/2003 | Kozlowski | |
| 6,573,784 B2 | 6/2003 | Gower | |
| 6,697,111 B1 | 2/2004 | Kozlowski | |
| 6,750,796 B1 | 6/2004 | Holloway | |
| 6,888,572 B1 | 5/2005 | Kozlowski | |
| 6,900,839 B1 | 5/2005 | Kozlowski | |
| 7,046,284 B2 | 5/2006 | Kozlowski | |
| 7,133,074 B1 | 11/2006 | Brehmer | |
| 2007/0210835 A1* | 9/2007 | Aghtar | 327/94 |
| 2008/0218602 A1 | 9/2008 | Kozlowski | |

* cited by examiner

*Primary Examiner*—Lincoln Donovan
*Assistant Examiner*—John W Poos
(74) *Attorney, Agent, or Firm*—Koppel, Patrick, Heybl & Dawson

(57) ABSTRACT

A correlated double sampling circuit and method for providing the same are disclosed. The circuit may include an amplifier, a plurality of capacitors, and a switch matrix. The amplifier provides a reset voltage replica and a signal voltage replica. The switch matrix controls a plurality of switches to perform correlated double sampling over at least three phases. The first phase for sampling the reset voltage replica on a first and second capacitors. The second phase for sampling the reset voltage replica and the kTC noise on a third capacitor. The first phase producing a thermal kTC noise from the first and second capacitors. The third phase for subtracting a charge representing the signal voltage replica, the kTC noise and the reset voltage replica, combined, from the charge sampled in the second phase to provide an output voltage. The method for providing low noise correlated double sampling includes controlling the plurality of switches to provide the at least three phases.

24 Claims, 4 Drawing Sheets

LOW NOISE CORRELATED DOUBLE SAMPLING AMPLIFIER FOR 4T TECHNOLOGY

U.S. GOVERNMENT RIGHTS

This invention was made with Government support awarded by the U.S. Department of the Navy, Naval Research laboratory (NRL), to Assurance Technology Corporation (ATC), and under purchase order 910548 awarded by ATC to Teledyne Scientific & Imaging, LLC. The Government has certain rights in the invention.

BACKGROUND

This disclosure relates generally to correlated double sampling. More specifically, this disclosure relates to low noise correlated double sampling amplifier for 4T CMOS Image sensor pixel technology and method for providing the same.

SUMMARY

A circuit for correlated double sampling with low noise and low power dissipation is disclosed. The circuit may include an amplifier, a plurality of capacitors and a switch matrix. The amplifier providing a reset voltage replica and a signal voltage replica. The plurality of capacitors coupled to the amplifier and may include a first capacitor, a second capacitor and a third capacitor. The switch matrix coupled to the amplifier and the plurality of capacitors, and configured to receive a voltage from the amplifier. The switch matrix is also configured to control a plurality of switches to perform correlated double sampling having at least three phases. The first phase for sampling a charge representing the reset voltage replica from the amplifier on the first and second capacitors. The first phase producing a thermal kTC noise from the first and second capacitors. The second phase for sampling a charge representing the reset voltage replica and the kTC noise on the third capacitor. The third phase for introducing the signal voltage replica in the switch matrix and for subtracting the signal voltage replica, the kTC noise and the reset voltage replica, combined, from the sum of reset voltage replica and kTC noise sampled in the second phase to provide an output voltage. In one embodiment, the third capacitor is larger than the first and second capacitors.

In one embodiment, a method for providing low noise correlated double sampling with at least three phases is disclosed. The method begins by controlling a plurality of switches to initiate a first phase for sampling a charge representing a reset voltage replica from an amplifier onto a first and second capacitors. Next, controlling the plurality of switches to initiate a second phase for sampling a charge representing the reset voltage replica and the kTC noise from the first phase onto a third capacitor. Then, controlling the plurality of switches to initiate a third phase for subtracting the sum of the signal voltage replica, the kTC noise, and the reset voltage replica, combined, from the sum of the pixel reset voltage replica and the kTC noise sampled in the second phase to provide an output voltage.

DRAWINGS

The above-mentioned features and objects of the present disclosure will become more apparent with reference to the following description taken in conjunction with the accompanying drawings wherein like reference numerals denote like elements and in which.

DETAILED DESCRIPTION

In the description that follows, the present invention will be described in reference to a preferred embodiment that provides low noise correlated double sampling for four transistor ("4T") CMOS image sensor pixel technology. The present invention, however, is not limited to any particular application nor is it limited by the examples described herein. Therefore, the description of the embodiments that follow are for purposes of illustration and not limitation.

4T pixel technology may be used with image sensors to perform Correlated Double Sampling (CDS) to remove kTC reset noise in a pixel. This CDS operation may be performed by a column amplifier, which adds an additional kTC noise contribution during the amplifier reset voltage replica sampling phase. One approach to removing this amplifier kTC noise was by adding a passive CDS stage following a first CDS stage. This second stage performs a CDS of the first stage to remove the amplifier kTC noise. However, this approach requires additional layout area and results in gain loss through the readout chain. Another approach to removing this amplifier kTC noise was by adding an active CDS stage following a first CDS stage. This second stage performs a CDS of the first stage to remove the amplifier kTC noise. However, this approach also requires additional layout area and power. Certainly, an alternative approach would be to refrain from using a second CDS stage. However, this would result in a higher readout noise, and as such, fails to utilize the full potential of the 4T pixel technology.

Hence, a correlated double sampling circuit with smaller layout area, higher sensitivity, lower power consumption and lower noise is preferable. As can be appreciated, the column amplifier noise problem may be overcome by performing a second CDS operation using the same column amplifier. Since the same column amplifier is being used, it requires no additional active circuitry, simply an additional capacitor and one or more switches.

Figure 1:
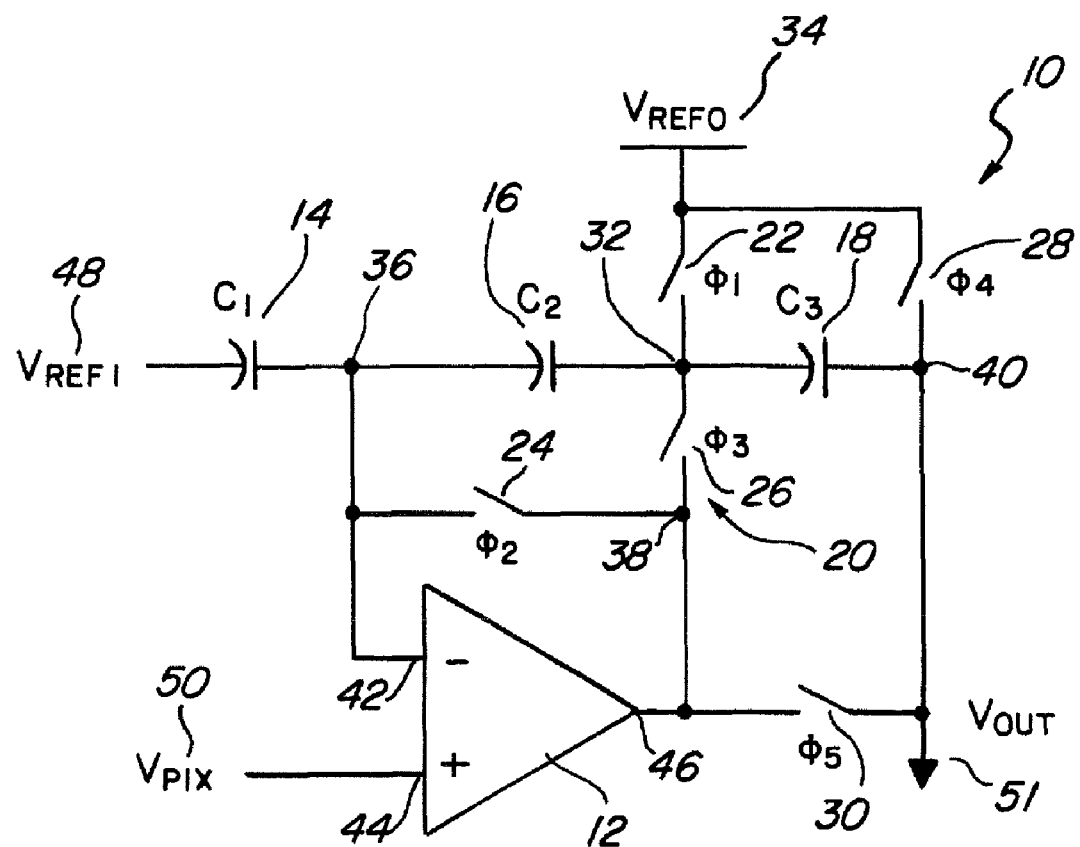
FIG. 1 is a low noise correlated double sampling circuit, according to an embodiment of the present disclosure.

FIG. 1 is a correlated double sampling circuit 10 with low noise and low power dissipation, according to an embodiment of the present disclosure. The correlated double sampling circuit 10 may include a differential amplifier 12, a plurality of capacitors 14, 16, 18 and a switch matrix 20. The amplifier 12 may be used to provide a replica of voltage $V_{PIX}$ 50, for example, a reset voltage replica from the 4T pixel and/or a signal voltage replica. The plurality of capacitors 14, 16, 18 may be coupled to the amplifier 12. The plurality of capacitors may include a first capacitor 14, a second capacitor 16 and a third capacitor 18. In one embodiment, the third capacitor 18 may be larger than the first and second capacitors 14, 16. The switch matrix 20 may be coupled to the amplifier 12 and the plurality of capacitors 14, 16, 18, and configured to receive a voltage replica of voltage $V_{PIX}$ 50 from the amplifier 12.

In one embodiment, the switch matrix 20 may be configured to control a plurality of switches to perform correlated double sampling. The plurality of switches may include a first switch 22 coupled between a second node 32 and a first voltage source 34, a second switch 24 coupled between a first node 36 and a third node 38, a third switch 26 coupled between the second node 32 and the third node 38, a fourth switch 28 coupled between a fourth node 40 and the first voltage source 34, and a fifth switch 30 coupled between the third node 38 and the fourth node 40. In one embodiment, the first capacitor 14 may be coupled between the first node 36 and a second voltage source 48, the second capacitor may be coupled between the first node 36 and the second node 32, and the third capacitor 18 may be coupled between the second node 32 and the fourth node 40. As can be appreciated, the amplifier 12 may be a differential amplifier with an inverting input 42 coupled to the first node 36, a non-inverting input 44 coupled to an input line, and an amplifier output 46 coupled to the third node 38.

According to one embodiment, the amplifier 12 may be used to perform correlated double sampling over at least three phases. The first phase for sampling the reset voltage replica from a 4T pixel on the first and second capacitors 14, 16. The first phase producing a thermal kTC noise from the first and second capacitors, where k is the Boltzman constant, T is the temperature in Kelvins and C is the capacitance. The second phase for sampling a charge representing the sum of the reset voltage replica and the kTC noise onto the third capacitor 18. The third phase for introducing the signal voltage replica into the switch matrix 20 and for subtracting the sum of the signal voltage replica, the kTC noise and the pixel reset voltage replica, combined, from the sum of the pixel reset voltage replica and the kTC noise sampled in the second phase to provide an output voltage.

Figure 2:
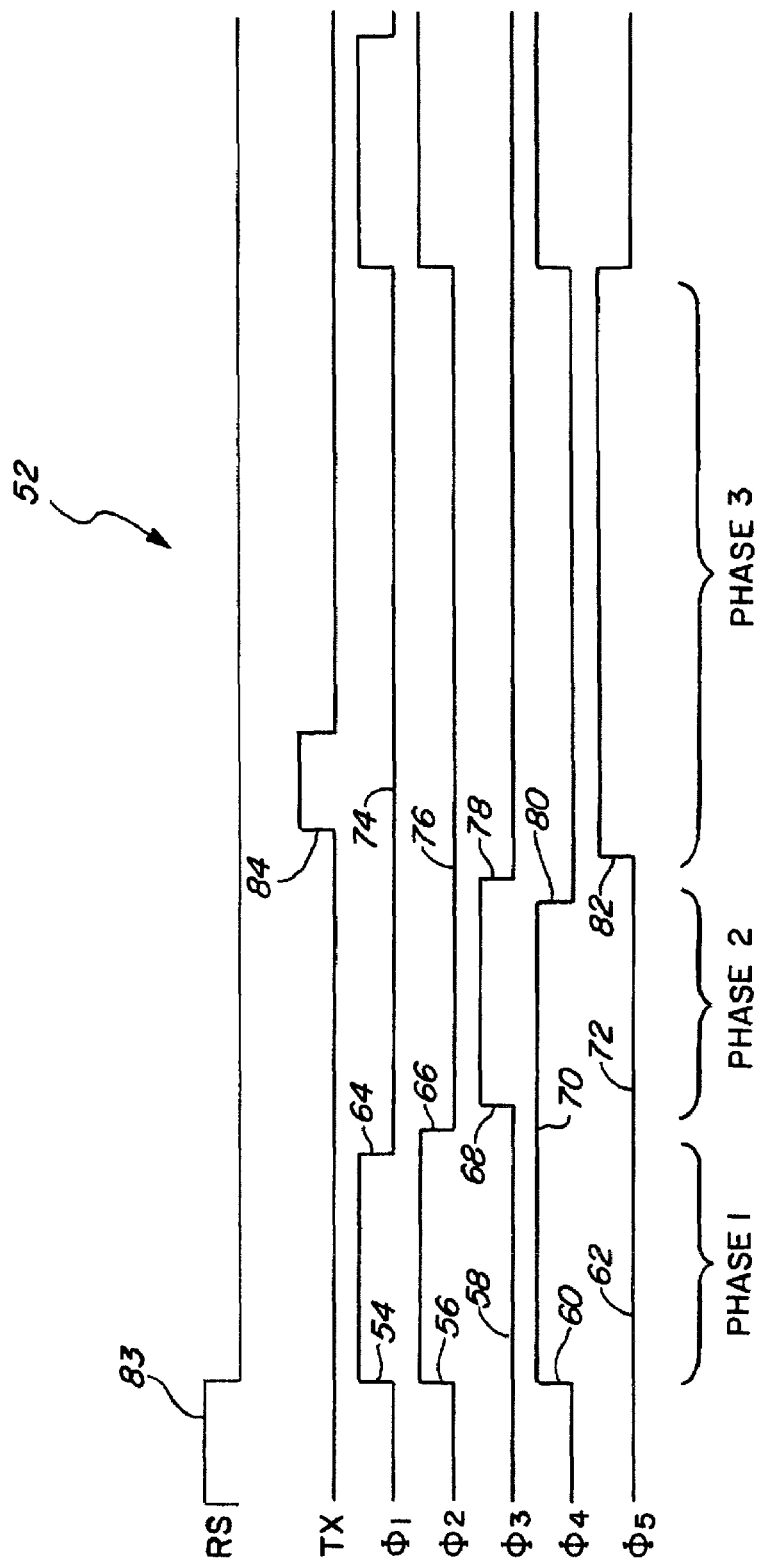
FIG. 2 is a timing diagram of the logic levels for the low noise correlated double sampling circuit of FIG. 1, according to an embodiment of the present disclosure.
Figure 3:
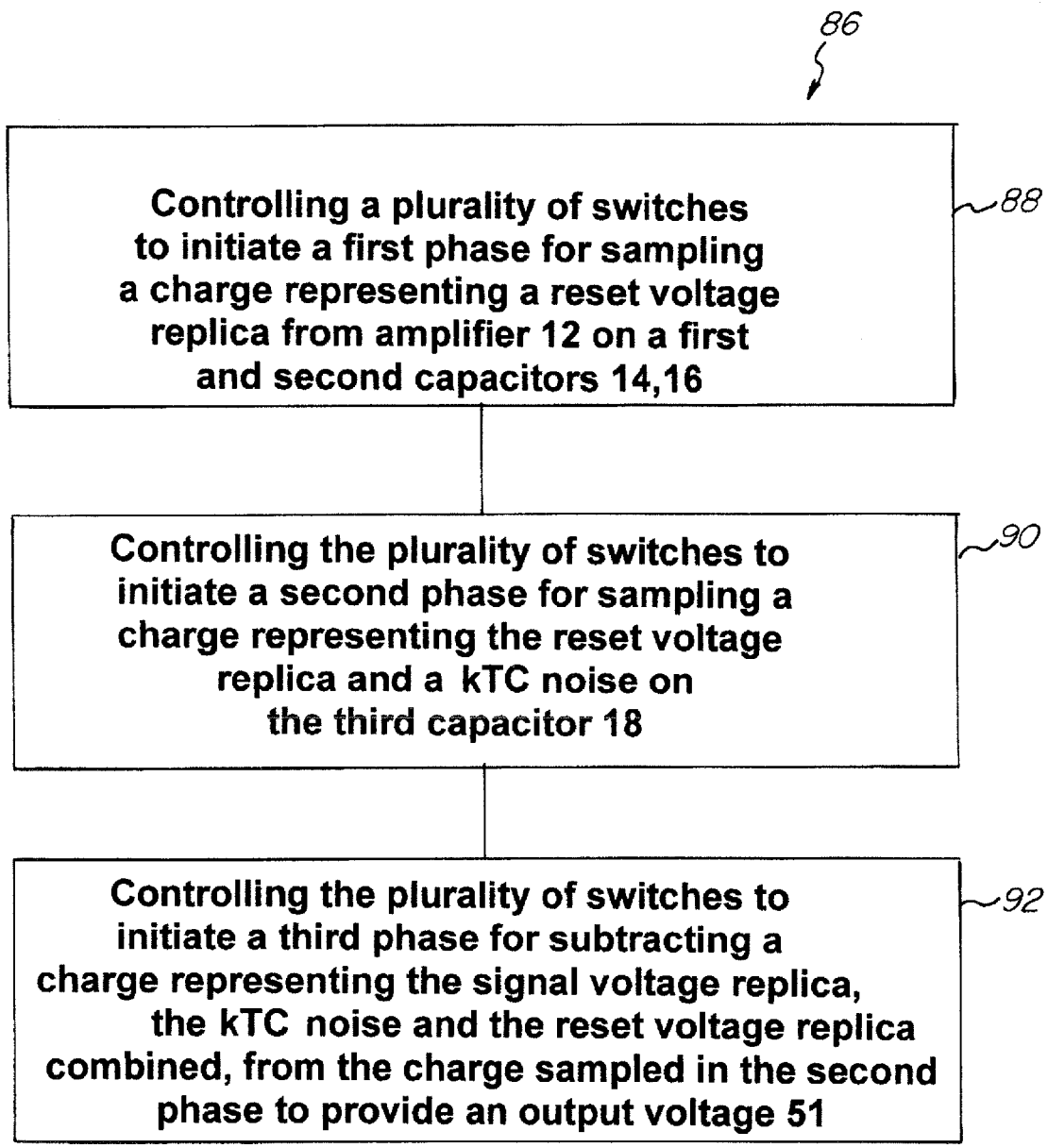
FIG. 3 is an exemplary flow chart outlining the operation of a switch matrix of FIG. 1, according to one embodiment of the present disclosure.

FIG. 2 is a timing diagram 52 of the logic levels for the low noise correlated double sampling circuit 10 of FIG. 1, according to an embodiment of the present disclosure. FIG. 3 is an exemplary flow chart 86 outlining the operation of the switch matrix 20 of FIG. 1. Prior to initiating the column amplifier operation, the pixel sense node is reset 83, establishing a fixed reset level that includes kTC noise on the pixel sense node. In operation, the low noise correlated double sampling circuit 10 begins the first phase by sampling the reset voltage replica generated by the amplifier 12 onto the first and second capacitors 14, 16. This may be accomplished by controlling the switch matrix to initiate the first phase (88). For example, the first phase may be initiated when the first switch 22 is closed by clocking it to high 54, the second switch 24 is closed by clocking it to high 56, the third switch 26 is opened by clocking it to low 58, the fourth switch 28 is closed by clocking it to high 60, and the fifth switch 30 is opened by clocking it to low 62. By controlling the plurality of switches, the first capacitor 14 may store a signal representation of the reset voltage replica in the form of a charge. Since the second capacitor 16 is parallel to the first capacitor 14, according to this embodiment, the second capacitor 16 may also have the same signal representation of the reset voltage replica, assuming low impedance from the second voltage source 48. In the first phase, the third capacitor 18 is shorted by closing the first switch 22 and the fourth switch 28. The first phase however may produce a thermal kTC noise from the first and second capacitors.

Next, the plurality of switches may be controlled to initiate the second phase with capacitor 16 in feedback to amplifier 12 and sampling a charge representation of the pixel reset voltage replica and the kTC noise from capacitors 14 and 16 onto the third capacitor 18 (90). In one embodiment, switching of the capacitive matrix between phase 1 and 2 may also provide a bandwidth filter to the noise of amplifier 12. To initiate the second phase, the first switch 22 may be opened by clocking it to low 64, the second switch 24 may be opened by clocking it to low 66, the third switch 26 is closed by clocking it to high 68, the fourth switch 28 is closed by clocking it to high 70, and the fifth switch 30 is opened by clocking it to low 72. In one embodiment, the second 24, third 26, and fifth 30 switches have non-overlapping clocks to avoid loss of charge stored on any of the 3 capacitors to a virtual ground when switching the switch matrix 20 from phase 1 to phase 2 and from phase 2 to phase 3, respectively.

As can be appreciated, the third capacitor 18 may be larger than the first and second capacitors 14, 16 to provide low noise with high gain. The third capacitor 18 may be connected in series with the second capacitor 16 in the third phase to provide a feedback path to amplifier 12. The third phase may be initiated when the first switch 22 is opened by clocking it to low 74, the second switch 24 is opened by clocking it to low 76, the third switch 26 is opened by clocking it to low 78, the fourth switch 28 is opened by clocking it to low 80, and the fifth switch 30 is closed by clocking it to high 82 (92). In one embodiment, the second 24, third 26, and fifth 30 switches have non-overlapping clocks to connect the third capacitor 18 and the second capacitor 16 in series with the inverting input 42 of the amplifier 12. The third capacitor 18 and the second capacitor 16 provide feedback capacitance to the amplifier 12 with high gain.

Next, a signal voltage replica may be transferred 84 to the correlated double sampling circuit 10 via amplifier 12. A charge representing the signal voltage replica, the kTC noise and the reset voltage replica, combined, may then be subtracted from the charge sampled in the second phase to provide an output voltage 51. In one embodiment, the output voltage 51 may be determined by the equation:

$$V_{OUT} = V_{REF0} - [V_{PIX(reset)} - V_{PIX(signal)}] \cdot \left[\frac{C1 \cdot (C2 + C3)}{C2 \cdot C3} + 1\right]$$

where, $V_{OUT}$ is the output voltage, $V_{REF0}$ is a DC supply voltage from a first voltage source 34 on the first capacitor 14, $V_{PIX(reset)}$ is the reset voltage replica initially introduced to the switch matrix 20 by the amplifier 12, $V_{PIX(signal)}$ is a signal voltage replica subsequently introduced to the switch matrix 20 by the amplifier 12, C1 is a capacitance of the first capacitor 14, C2 is a capacitance of the second capacitor 16, and C3 is a capacitance of the third capacitor 18.

In one embodiment, the DC supply voltage from the first voltage source 34, $V_{REF0}$ and the DC supply voltage from the second voltage source 48, $V_{REF1}$, may be set at zero volts. As is understood by a person skilled in the art, $V_{PIX(signal)}$ may represent the signal voltage replica along with the reset voltage replica.

Figure 4:
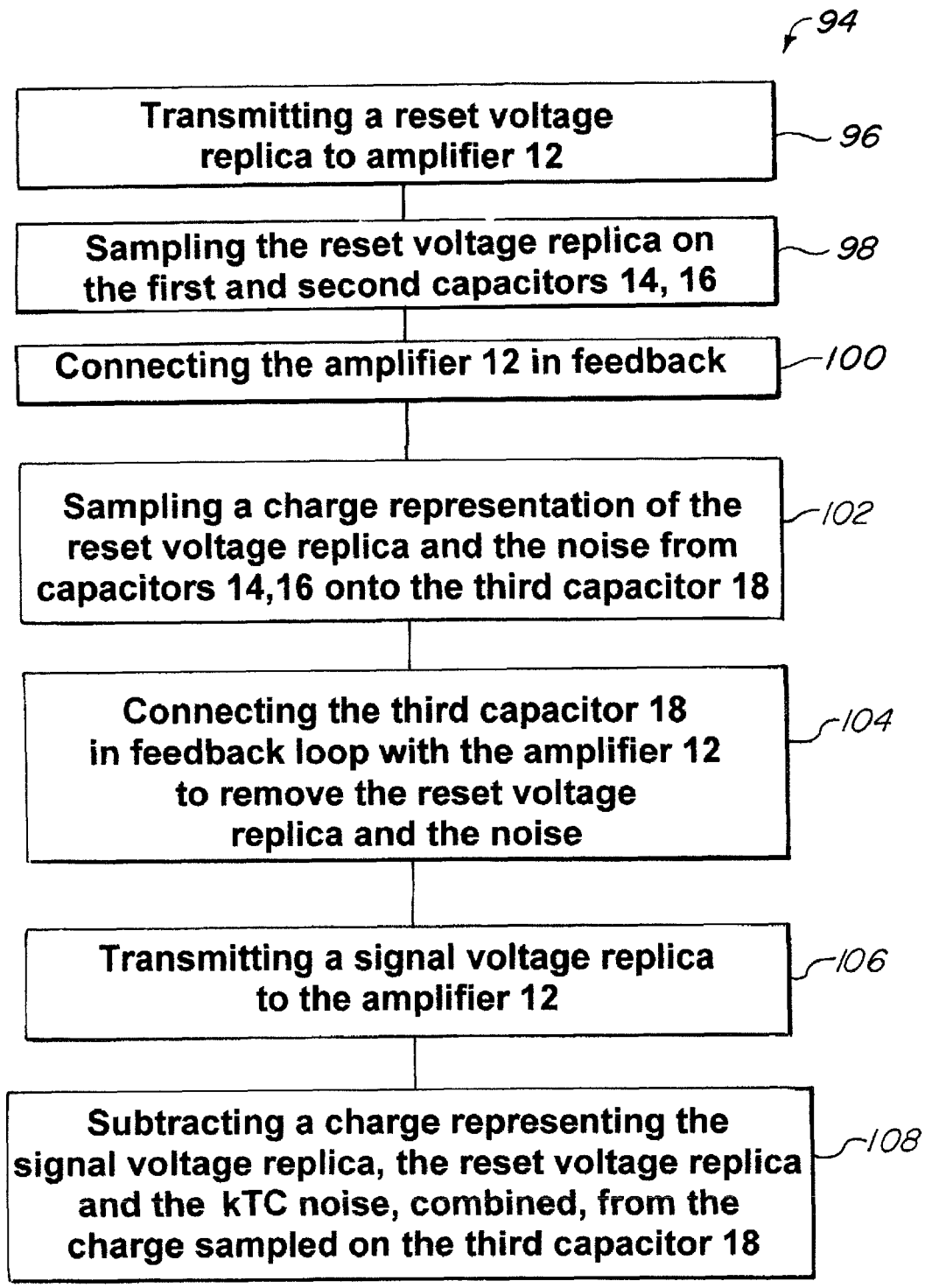
FIG. 4 is an exemplary flow chart outlining a method for providing low noise correlated double sampling, according to one embodiment of the present disclosure.

FIG. 4 is an exemplary flow chart 94 outlining a method for providing low noise correlated double sampling, according to one embodiment of the present disclosure. The method begins by transmitting a reset voltage replica to the correlated double sampling circuit 10, for example, from a pixel (96). Next, the reset voltage replica may be sampled on the first and second capacitors 14, 16 (98). The amplifier 12 may then be connected with capacitors 14 and 16 in series creating a feedback loop to the inverting input of amplifier 12 (100). Next, sampling a charge representation of the pixel reset voltage replica and the noise from capacitors 14, 16 onto the third capacitor 18 (102). The third capacitor 18 may then be connected in feedback loop with the amplifier 12 to remove the pixel reset voltage replica and thermal capacitor noise from the output signal (104). Next, a signal voltage replica may be added to the amplifier 12 input, for example, from a pixel (106). This will generate an output signal free of pixel reset noise and thermal noise from capacitors 14 and 16 (108). In one embodiment, the difference between the signal voltage replica, the pixel reset voltage replica and the kTC noise, combined, and the pixel reset voltage replica and the kTC noise may be amplified.

As can be appreciated, this method may be used to remove kTC reset noise in 4T pixel, kTC reset or switching noise on the first and second capacitors 14, 16, and offset voltage of amplifier 12. The correlated double sampling circuit 10 of the present disclosure and method for providing the same provide an analog subtraction stage with low noise, small area and low power dissipation. Applications for the low noise correlated double sampling circuit 10 and method for providing the same, may include monolithic CMOS 4T imagers with low noise, low power and small pixel pitch specifications. Applications may also include high gain, low noise pre-amplifier for photodetectors.

While the low noise correlated double sampling amplifier for 4T technology and method for providing the same have been described in terms of what are presently considered to be the most practical and preferred embodiments, it is to be understood that the disclosure need not be limited to the disclosed embodiments. It should also be understood that a variety of changes may be made without departing from the essence of the invention. Such changes are also implicitly included in the description. They still fall within the scope of this disclosure. It should be understood that this disclosure is intended to yield a patent covering numerous aspects of the invention both independently and as an overall system and in both method and apparatus modes.

Further, each of the various elements of the invention and claims may also be achieved in a variety of manners. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled.

It should be understood that all actions may be expressed as a means for taking that action or as an element which causes that action. Similarly, each physical element disclosed should be understood to encompass a disclosure of the action which that physical element facilitates.

It should be understood that various modifications and similar arrangements are included within the spirit and scope of the claims, the scope of which should be accorded the broadest interpretation so as to encompass all such modifications and similar structures. The present disclosure includes any and all embodiments of the following claims.

The invention claimed is:

1. A circuit for correlated double sampling with low noise and low power dissipation, the circuit comprising:
    an amplifier having an input which is directly connected to a reset voltage or a signal voltage and is arranged to provide a reset voltage replica and a signal voltage replica;
    a plurality of capacitors coupled to the amplifier, the plurality of capacitors including a first capacitor, a second capacitor and a third capacitor; and
    a switch matrix coupled to the amplifier and the plurality of capacitors, and configured to receive a voltage from the amplifier,
    wherein the switch matrix is configured to control a plurality of switches to perform correlated double sampling, the correlated double sampling having at least three phases including: a first phase for sampling a charge representing the reset voltage replica from the amplifier on the first and second capacitors while producing a kTC noise from the first and second capacitors, a second phase for sampling a charge representing the reset voltage replica and the kTC noise on the third capacitor, and a third phase for introducing the signal voltage replica in the switch matrix and for subtracting a charge representing the signal voltage replica, the kTC noise and the reset voltage replica, combined, from the charge sampled in the second phase to provide an output voltage.

2. The circuit of claim 1, wherein the third capacitor is larger than the first and second capacitors.

3. A circuit for correlated double sampling with low noise and low power dissipation, the circuit comprising:
    an amplifier providing a reset voltage replica and a signal voltage replica;
    a plurality of capacitors coupled to the amplifier, the plurality of capacitors including a first capacitor, a second capacitor and a third capacitor; and
    a switch matrix coupled to the amplifier and the plurality of capacitors, and configured to receive a voltage from the amplifier,
    wherein the switch matrix is configured to control a plurality of switches to perform correlated double sampling, the correlated double sampling having at least three phases including: a first phase for sampling a charge representing the reset voltage replica from the amplifier on the first and second capacitors while producing a kTC noise from the first and second capacitors, a second phase for sampling a charge representing the reset voltage replica and the kTC noise on the third capacitor, and a third phase for introducing the signal voltage replica in the switch matrix and for subtracting a charge representing the signal voltage replica, the kTC noise and the reset voltage replica, combined, from the charge sampled in the second phase to provide an output voltage,
    wherein the plurality of switches comprises:
    a first switch coupled between a second node and a first voltage source,
    a second switch coupled between a first node and a third node,
    third switch coupled between the second node and the third node,
    fourth switch coupled between a fourth node and the first voltage source, and
    a fifth switch coupled between the third node and the fourth node.

4. The circuit of claim 2, wherein the first capacitor is coupled between the first node and a second voltage source, the second capacitor is coupled between the first node and the second node, and the third capacitor is coupled between the second node and the fourth node.

5. The circuit of claim 3, wherein the first phase is initiated when the first switch is closed, the second switch is closed, the third switch is opened, the fourth switch is closed, and the fifth switch is opened.

6. The circuit of claim 3, wherein the second phase is initiated when the first switch is opened, the second switch is opened, the third switch is closed, the fourth switch is closed, and the fifth switch is opened.

7. The circuit of claim 3, wherein the third phase is initiated when the first switch is opened, the second switch is opened, the third switch is opened, the fourth switch is opened, and the fifth switch is closed.

8. The circuit of claim 3, wherein the amplifier is a differential amplifier with an inverting input coupled to the first node, a non-inverting input coupled to an input line, and an amplifier output coupled to the third node.

9. A circuit for correlated double sampling with low noise and low power dissipation, the circuit comprising:
an amplifier providing a reset voltage replica and a signal voltage replica;
a plurality of capacitors coupled to the amplifier, the plurality of capacitors including a first capacitor, a second capacitor and a third capacitor; and
a switch matrix coupled to the amplifier and the plurality of capacitors, and configured to receive a voltage from the amplifier,
wherein the switch matrix is configured to control a plurality of switches to perform correlated double sampling, the correlated double sampling having at least three phases including: a first phase for sampling a charge representing the reset voltage replica from the amplifier on the first and second capacitors while producing a kTC noise from the first and second capacitors, a second phase for sampling a charge representing the reset voltage replica and the kTC noise on the third capacitor, and a third phase for introducing the signal voltage replica in the switch matrix and for subtracting a charge representing the signal voltage replica, the kTC noise and the reset voltage replica, combined, from the charge sampled in the second phase to provide an output voltage,
wherein the control of the plurality of switches in the first phase produces a switching noise sampled on the third capacitor in the second phase.

10. A circuit for correlated double sampling with low noise and low power dissipation, the circuit comprising:
an amplifier providing a reset voltage replica and a signal voltage replica;
a plurality of capacitors coupled to the amplifier, the plurality of capacitors including a first capacitor, a second capacitor and a third capacitor; and
a switch matrix coupled to the amplifier and the plurality of capacitors, and configured to receive a voltage from the amplifier,
wherein the switch matrix is configured to control a plurality of switches to perform correlated double sampling, the correlated double sampling having at least three phases including: a first phase for sampling a charge representing the reset voltage replica from the amplifier on the first and second capacitors while producing a kTC noise from the first and second capacitors, a second phase for sampling a charge representing the reset voltage replica and the kTC noise on the third capacitor, and a third phase for introducing the signal voltage replica in the switch matrix and for subtracting a charge representing the signal voltage replica, the kTC noise and the reset voltage replica, combined, from the charge sampled in the second phase to provide an output voltage,
wherein the output voltage is determined by the equation:

$$V_{OUT} = V_{REF0} - [V_{PIX(reset)} - V_{PIX(signal)}] \cdot \left[ \frac{C1 \cdot (C2 + C3)}{C2 \cdot C3} + 1 \right]$$

where,
$V_{OUT}$ is the output voltage,
$V_{REF0}$ is a DC supply voltage from a first voltage source on the first capacitor,
$V_{PIX(reset)}$ is the reset voltage replica initially introduced to the switch matrix by the amplifier,
$V_{PIX(signal)}$ is the signal voltage replica subsequently introduced to the switch matrix by the amplifier,
C1 is a capacitance of the first capacitor,
C2 is a capacitance of the second capacitor, and
C3 is a capacitance of the third capacitor.

11. A correlated double sampling circuit comprising:
an amplifier having an input which is directly connected to a reset voltage or a signal voltage and is arranged to provide a reset voltage replica and a signal voltage replica;
a plurality of capacitors coupled to the amplifier, the plurality of capacitors including a first capacitor, a second capacitor and a third capacitor; and
controlling means, coupled to the amplifier and the plurality of capacitors, for providing correlated double sampling with at least three phases including:
a first phase for sampling a charge representing the reset voltage replica from the amplifier on the first and second capacitors while producing a kTC noise from the first and second capacitors,
a second phase for sampling a charge representing the reset voltage replica and the kTC noise on the third capacitor, and
a third phase for subtracting a charge representing the signal voltage replica, the kTC noise and the reset voltage replica, combined, from the charge sampled in the second phase to provide an output voltage.

12. The correlated double sampling circuit of claim 11, wherein the third capacitor is larger than the first and second capacitors.

13. A correlated double sampling circuit comprising:
an amplifier providing a reset voltage replica and a signal voltage replica;
a plurality of capacitors coupled to the amplifier, the plurality of capacitors including a first capacitor, a second capacitor and a third capacitor; and
controlling means, coupled to the amplifier and the plurality of capacitors, for providing correlated double sampling with at least three phases including:
a first phase for sampling a charge representing the reset voltage replica from the amplifier on the first and second capacitors while producing a kTC noise from the first and second capacitors,
a second phase for sampling a charge representing the reset voltage replica and the kTC noise on the third capacitor, and
a third phase for subtracting a charge representing the signal voltage replica, the kTC noise and the reset voltage replica, combined, from the charge sampled in the second phase to provide an output voltage, wherein the controlling means comprises a plurality of switches including: a first switch coupled between a second node and a first voltage source, a second switch coupled between a first node and a third node, a third switch coupled between the second node and the third node, a fourth switch coupled between a fourth node and the first voltage source, and a fifth switch coupled between the third node and a fourth node.

14. The correlated double sampling circuit of claim 13, wherein the first capacitor is coupled between the first node and a second voltage source, the second capacitor is coupled between the first node and the second node, and the third capacitor is coupled between the second node and the fourth node.

15. The correlated double sampling circuit of claim 13, wherein the first phase is initiated when the first switch is closed, the second switch is closed, the third switch is opened, the fourth switch is closed, and the fifth switch is opened, the second phase is initiated when the first switch is opened, the second switch is opened, the third switch is closed, the fourth switch is closed, and the fifth switch is opened, and the third phase is initiated when the first switch is opened, the second switch is opened, the third switch is opened, the fourth switch is opened, and the fifth switch is closed.

16. The correlated double sampling circuit of claim 13, wherein the amplifier is a differential amplifier with an inverting input coupled to the first node, a non-inverting inverting input coupled to an input line, and an amplifier output coupled to the third node.

17. A correlated double sampling circuit comprising:
an amplifier providing a reset voltage replica and a signal voltage replica;
a plurality of capacitors coupled to the amplifier, the plurality of capacitors including a first capacitor, a second capacitor and a third capacitor; and
controlling means, coupled to the amplifier and the plurality of capacitors, for providing correlated double sampling with at least three phases including:
a first phase for sampling a charge representing the reset voltage replica from the amplifier on the first and second capacitors while producing a kTC noise from the first and second capacitors,
a second phase for sampling a charge representing the reset voltage replica and the kTC noise on the third capacitor, and
a third phase for subtracting a charge representing the signal voltage replica, the kTC noise and the reset voltage replica, combined, from the charge sampled in the second phase to provide an output voltage,
wherein the output voltage is determined by the equation:

$$V_{OUT} = V_{REF0} - [V_{PIX(reset)} - V_{PIX(signal)}] \cdot \left[ \frac{C1 \cdot (C2 + C3)}{C2 \cdot C3} + 1 \right]$$

where,
$V_{OUT}$ is the output voltage,
$V_{REFO}$ is a DC supply voltage from a first voltage source on the first capacitor,
$V_{PIX(reset)}$ is the reset voltage replica initially introduced to the switch matrix by the amplifier,
$V_{PIX(signal)}$ is the signal voltage replica subsequently introduced to the switch matrix by the amplifier,
C1 is a capacitance of the first capacitor,
C2 is a capacitance of the second capacitor, and
C3 is a capacitance of the third capacitor.

18. A method for providing low noise correlated double sampling with at least three phases, the method comprising:
controlling a plurality of switches to initiate a first phase for sampling a charge representing a reset voltage replica from an amplifier on a first and second capacitors, the first and second capacitors providing a kTC noise;
controlling the plurality of switches to initiate a second phase for sampling a charge representing the reset voltage replica and the KTC noise on a third capacitor; and
controlling the plurality of switches to initiate a third phase for subtracting a charge representing a signal voltage replica, the kTC noise and the reset voltage replica, combined, from the charge sampled in the second phase to provide an output voltage.

19. The method of claim 18, wherein the output voltage is determined by the equation:

$$V_{OUT} = V_{REF0} - [V_{PIX(reset)} - V_{PIX(signal)}] \cdot \left[ \frac{C1 \cdot (C2 + C3)}{C2 \cdot C3} + 1 \right]$$

where,
$V_{OUT}$ is the output voltage,
$V_{REFO}$ is a DC supply voltage from a first voltage source on the first capacitor,
$V_{PIX(reset)}$ is the reset voltage replica initially introduced to the switch matrix by the amplifier,
$V_{PIX(signal)}$ is the signal voltage replica subsequently introduced to the switch matrix by the amplifier,
C1 is a capacitance of the first capacitor,
C2 is a capacitance of the second capacitor, and
C3 is a capacitance of the third capacitor.

20. The method of claim 18, wherein the plurality of switches comprises:
a first switch coupled between a second node and a first voltage source,
a second switch coupled between a first node and a third node,
a third switch coupled between the second node and the third node,
a fourth switch coupled between a fourth node and the first voltage source, and
a fifth switch coupled between the third node and a fourth node.

21. The method of claim 20, wherein controlling a plurality of switches to initiate a first phase comprises closing the first switch, closing the second switch, opening the third switch, closing the fourth switch, and opening the fifth switch.

22. The method of claim 20, wherein controlling a plurality of switches to initiate a second phase comprises opening the first switch, opening the second switch, closing the third switch, closing the fourth switch, and opening the fifth switch.

23. The method of claim 20, wherein controlling a plurality of switches to initiate a third phase comprises opening the first switch, opening the second switch, opening the third switch, opening the fourth switch, and closing the fifth switch.

24. The method of claim 18, wherein controlling a plurality of switches to initiate a first phase produces a switching noise sampled on the third capacitor in the second phase.

* * * * *